United States Patent
Piper et al.

(10) Patent No.: US 7,631,286 B2
(45) Date of Patent: Dec. 8, 2009

(54) AUTOMATED METROLOGY RECIPE GENERATION

(75) Inventors: Daniel Piper, Vancouver, WA (US); Scott Westfall, Oregon City, OR (US)

(73) Assignee: Wafertech LLC, Camas, WA (US)

( * ) Notice: Subject to any disclaimer, the term of this patent is extended or adjusted under 35 U.S.C. 154(b) by 600 days.

(21) Appl. No.: 11/323,255

(22) Filed: Dec. 30, 2005

(65) Prior Publication Data

US 2007/0156275 A1 Jul. 5, 2007

(51) Int. Cl.
G06F 17/50 (2006.01)
G01R 31/26 (2006.01)

(52) U.S. Cl. ............... 716/19; 716/1; 716/4; 716/20; 716/21; 438/14

(58) Field of Classification Search ............. 716/4, 716/10, 19, 21; 703/1, 14
See application file for complete search history.

(56) References Cited

U.S. PATENT DOCUMENTS

| | | | |
|---|---|---|---|
| 5,777,327 A | 7/1998 | Mizuno | |
| 5,926,690 A | 7/1999 | Toprac et al. | |
| 6,072,178 A | 6/2000 | Mizuno | |
| 6,157,451 A | 12/2000 | Mizuno | |
| 6,259,960 B1 | 7/2001 | Inokuchi | |
| 6,303,395 B1 | 10/2001 | Nulman | |
| 6,324,298 B1 | 11/2001 | O'Dell et al. | |
| 6,388,253 B1 | 5/2002 | Su | |
| 6,392,229 B1 | 5/2002 | Dana et al. | |
| 6,433,561 B1 | 8/2002 | Satya et al. | |
| 6,493,082 B2 | 12/2002 | Nara et al. | |
| 6,507,945 B1 | 1/2003 | Rust et al. | |
| 6,509,750 B1 | 1/2003 | Talbot et al. | |
| 6,515,296 B1 | 2/2003 | Komatsu et al. | |
| 6,556,949 B1 | 4/2003 | Lyon | |
| 6,587,744 B1 | 7/2003 | Stoddard et al. | |
| 6,625,497 B2 | 9/2003 | Fairbairn et al. | |
| 6,665,575 B2 | 12/2003 | Betawar et al. | |
| 6,710,852 B2 | 3/2004 | Chen et al. | |
| 6,713,761 B2 | 3/2004 | Nakada et al. | |
| 6,770,868 B1 | 8/2004 | Bevis et al. | |
| 6,770,879 B1 | 8/2004 | Azordegan et al. | |
| 6,826,298 B1 | 11/2004 | O'Dell et al. | |
| 6,886,153 B1 | 4/2005 | Bevis | |
| 7,003,758 B2 * | 2/2006 | Ye et al. ................. | 716/21 |
| 7,047,101 B1 * | 5/2006 | Young et al. ............ | 700/121 |
| 7,155,689 B2 * | 12/2006 | Pierrat et al. ........... | 716/4 |
| 7,187,993 B2 * | 3/2007 | Kay et al. .............. | 700/110 |
| 7,207,017 B1 * | 4/2007 | Tabery et al. ........... | 716/4 |
| 7,328,418 B2 * | 2/2008 | Yamashita et al. ........ | 716/10 |
| 7,346,883 B2 * | 3/2008 | Keck et al. ............. | 716/19 |
| 2002/0165636 A1 | 11/2002 | Hasan | |
| 2003/0106642 A1 | 6/2003 | Fairbairn et al. | |
| 2003/0123034 A1 | 7/2003 | Chen et al. | |

(Continued)

*Primary Examiner*—Helen Rossoshek
(74) *Attorney, Agent, or Firm*—Duane Morris LLP (57) ABSTRACT

A method, system and encoded computer instructions provide for automatic generation of a metrology recipe without referencing a wafer. The highly accurate metrology recipe provides for locating measurement locations corresponding to test features on the wafer and directing the metrology tool to the locations, by calculating coordinates for the measurement locations based on mask data, lithography tool data, CAD data and process data. The metrology recipe directs the metrology tool to within 10 microns of test features formed on the wafer. Criteria may be input to a data base to identify multiple existing recipes and the automatically generated recipe may be generated to replace each identified recipe.

32 Claims, 5 Drawing Sheets

U.S. PATENT DOCUMENTS

| | | |
|---|---|---|
| 2004/0017575 A1 | 1/2004 | Balasubramanian et al. |
| 2004/0027572 A1 | 2/2004 | Ebert et al. |
| 2004/0030430 A1* | 2/2004 | Matsuoka .................. 700/108 |
| 2004/0086169 A1 | 5/2004 | Cao et al. |
| 2004/0102934 A1 | 5/2004 | Chang |
| 2004/0228515 A1 | 11/2004 | Okabe et al. |
| 2004/0267399 A1 | 12/2004 | Funk |
| 2005/0010890 A1 | 1/2005 | Nehmadi et al. |
| 2005/0075841 A1 | 4/2005 | Peles et al. |
| 2007/0050749 A1* | 3/2007 | Ye et al. ........................ 716/20 |
| 2007/0061772 A1* | 3/2007 | Ye et al. ........................ 716/21 |
| 2007/0061773 A1* | 3/2007 | Ye et al. ........................ 716/21 |
| 2007/0176141 A1* | 8/2007 | Lane et al. .................. 252/79.1 |
| 2007/0238201 A1* | 10/2007 | Funk et al. ................... 438/14 |
| 2007/0276634 A1* | 11/2007 | Smith et al. ..................... 703/1 |
| 2007/0288219 A1* | 12/2007 | Zafar et al. ................... 703/14 |

* cited by examiner

AUTOMATED METROLOGY RECIPE GENERATION

FIELD OF THE INVENTION

The present invention relates to the semiconductor manufacturing industry, and particularly, to a waferless metrology recipe generator, the method for generating such a recipe, a computer program product with encoded instructions for generating the recipe, and a system for measuring a test feature using such a recipe.

BACKGROUND

In the semiconductor manufacturing industry, the method for creating recipes for scanning electron microscopes (SEMs) and other metrology equipment has historically been a manual operation with human operator intervention. This has generally been the case in the production environment as well as in the evaluation and qualification of metrology equipment. The manual methods may require that the recipe developer collect various items of information related to the exposure of a mask level, then, after programming such information into the SEM or other metrology tool, visually and manually search on the patterned wafer to be measured, to manually locate the test feature. This is labor intensive and time consuming. After inputting the various data then manually locating the test feature to be measured, the recipe developer must then input additional information to allow the recipe generator to generate a useable recipe for carrying out various metrology measurements on fabricated test structures.

This operation sequence is required to be carried out at each of the multiple mask levels used in manufacturing a semiconductor device. Alternatively stated, for each semiconductor device or part, there are multiple metrology recipes that must be created, sometimes up to thirty (30) or more. While some waferless metrology recipe generation techniques are known, the known techniques lack the accuracy necessary for the pattern recognition capabilities of the metrology equipment being used and typical automatic recipes frequently result in the metrology tool failing to find the test feature and an error signal being generated. Because of these shortcomings, the typical method of locating a test structure remains loading a patterned wafer into the SEM or other metrology tool and visually searching within the exposure field to find the test structure. Only after the feature is visually located using manual techniques, the recipe editor software available in the metrology tool may be used to generate the recipe. The labor intensive and time consuming process of manually finding the test feature can be made more difficult depending on the mask layout, for example if chip sizes are small and the number of scribe lines is therefore increased.

It would therefore be advantageous to provide a method and system for metrology recipe generation that does not require the patterned wafer to be referenced at all, much less visually scanned. Some waferless metrology recipe generation techniques are known in the art, such as U.S. Pat. No. 6,886,153 B1 to Bevis, issued Apr. 26, 2005 and United States Patent Application Publication U.S. 2004/0030430 A1 to Matsuoka, filed Jun. 26, 2003. These and other conventional waferless metrology recipe generators include various shortcomings that preclude these teachings from providing a method to automatically generate a metrology recipe without referencing a wafer and which provides accuracy that positions the cursor or measurement focus of the metrology system within 10 microns of the test structure to be measured.

It would therefore be desirable to provide such an automatic metrology wafer generation method. It would be further desirable to provide a method and system that queries various available databases to also obtain the necessary information required to generate such a recipe.

SUMMARY OF THE INVENTION

To address these and other needs, and in view of its purposes, one aspect of the present invention provides a method for automatic generation of a metrology recipe for measuring a test feature in a pattern transferred from a mask onto a wafer without referencing the test feature formed on the actual wafer. The method includes determining coordinates of at least one measurement location on the wafer by manipulating mask data, CAD data and lithography tool data. The measurement location corresponds to a location at which the test feature is formed on the wafer. The mask data includes field size of a mask image, width of a scribe line peripherally surrounding the mask image, center shift of the mask image relative to a mask origin, and test structure coordinates indicative of the test structure origin relative to the mask origin. The CAD data includes test feature coordinate data indicative of a position of the test feature relative to the test structure origin and the lithography tool data includes a mask magnification factor. The method further includes automatically creating a recipe to direct a metrology tool to at least one measurement location without referencing the test feature as formed on the wafer.

The method further comprises providing the metrology recipe to the metrology tool and the metrology tool automatically measuring the test feature at the measurement location.

According to another aspect, the invention provides a further method for automatic generation of a metrology recipe for measuring a test feature in a pattern transferred from a mask onto a wafer without referencing the test feature. The further method comprises querying a process database to identify a mask, querying a mask server to obtain mask data, querying a user defined database to obtain CAD data, querying a lithography database to obtain lithography tool data and manipulating the mask data, CAD data and lithography tool data. The measurement location corresponds to a location at which the test feature is formed on the wafer. The CAD data and mask data are dependent on the mask identified. The method further provides for determining at least one measurement location on the wafer, the measurement location having coordinates determined by the mask data, CAD data and lithography tool data. The method further provides for automatically creating a recipe that directs the metrology tool to at least one measurement location without referencing the test feature as formed on the wafer.

According to another aspect, the invention provides a computer program product with encoded instructions for performing operations for the automatic generation of a metrology recipe for measuring a test feature in a pattern transferred from a mask onto a wafer, without referencing the test feature. Included are instructions for determining coordinates of at least one measurement location on the wafer by manipulating mask data, CAD data and lithography tool data. The mask data includes field size of a mask image, width of a scribe line peripherally surrounding the mask image, center shift of the mask image relative to a mask origin, and test structure coordinates indicative of a test structure origin relative to the mask origin. The CAD data includes test feature coordinate data indicative of a position of the test structure relative to the test structure origin. The lithography tool data includes a mask magnification factor. The method also provides for automatically creating a recipe to direct the metrology tool to at least one of the measurement locations without referencing the test feature as formed on the wafer.

According to another aspect, a method for automatically creating at least one metrology recipe is provided. The method includes providing a database containing a plurality of existing first recipes for metrology measurements and inputting at least one criterion to a system that accesses the database. A computer product reviews the database and identifies at least one identified recipe of the plurality of existing first recipes that satisfies the at least one criteria. The method further includes modifying each identified recipe by automatically generating a metrology recipe for measuring a test feature in a pattern transferred from a mask onto a wafer, without referencing the test feature. The metrology recipe replaces the identified recipe and the method for automatically generating includes determining coordinates of at least one measurement location of the test feature on the wafer by manipulating mask data, CAD data, and lithography tool data. The mask data includes field size of a mask image, width of a scribe line peripherally surrounding the mask image, center shift of the mask image relative to a mask origin, and test structure coordinates indicative of a test structure origin relative to the mask origin. The CAD data includes test feature coordinate data indicative of a position of the test feature relative to the test structure origin and the lithography tool data includes a mask magnification factor. The method further includes automatically creating the metrology recipe to direct a metrology tool to at least one measurement location without referencing a test feature formed on the wafer.

In another aspect, a computer program product of the invention provides encoded instructions for performing operations for the automatic generation of a metrology recipe for measuring a test feature in a pattern transferred from a mask onto a wafer without referencing the test feature. The instructions include instructions for querying a process database to identify a mask, querying a mask server to obtain mask data, querying a user defined database to obtain CAD data, querying a lithography tool database to obtain lithography tool data and manipulating the mask data, CAD data and lithography tool data. The CAD data and mask data are dependent on the identified mask. The encoded instructions further provide for determining at least one measurement location on the wafer, the measurement location having coordinates determined by the mask data, the CAD data and the lithography tool data, and for automatically creating the recipe for the metrology tool to perform a measurement operation at at least one measurement location without referencing the test feature as formed on the wafer.

Another aspect of the invention is a metrology recipe creation system for automatic generation of a metrology recipe for measuring a test feature in a pattern transferred from a mask onto a wafer without referencing the test feature. The system comprises a metrology tool, means for determining coordinates of at least one measurement location on the wafer by manipulating mask data, CAD data and lithography tool data and means for automatically creating a recipe that directs the metrology tool to at least one measurement location without referencing the test feature as formed on the wafer. The mask data includes field size of a mask image, width of a scribe line peripherally surrounding the mask image, center shift of the mask image relative to a mask origin and test structure coordinates indicative of a test structure origin relative to the mask origin. The CAD data includes test feature coordinate data indicative of a position of the test feature relative to the test structure origin and the lithography tool data includes a mask magnification factor.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The present invention provides a method, software and apparatus for the automatic generation and execution of a metrology recipe that does not require referencing the wafer to be measured, visually or by any other means. The invention provides for querying various data bases to obtain a combination of data from which a recipe can be generated, such recipe directing a metrology tool such as a SEM to one or more locations on a wafer at which the metrology tool will measure a desired test feature. In each case, the locations to which the cursor, crosshair or other measurement feature of the metrology tool is directed, are advantageously within 10 microns of the actual test feature which is formed on the wafer. The recipe may direct the metrology tool to perform a desired metrology measurement at the measurement location. A recipe generator automatically creates the recipe and sends the recipe to a metrology tool such as a SEM (scanning electron microscope). A plurality of such metrology recipes may be automatically created to overwrite and replace each recipe in a database of existing recipes, that satisfies a particular criterion.

With the metrology recipe provided to the metrology tool, the invention further comprises the metrology tool automatically measuring the test feature at the measurement location.

The invention is advantageously used in conjunction with a reticle which is a mask with an image that is stepped repeatedly onto a wafer to produce a pattern on the wafer which thereby represents an aggregate, typically an array, of a plurality of the image of the reticle. The lithography tool used to step this pattern repeatedly onto a wafer is referred to as a stepper. The test feature to be measured is included in the reticle and is thereby formed a plurality of times on the wafer. The recipe is automatically created from the data obtained and directs the SEM or other metrology tools to one or various measurement locations on the wafer without referencing the test feature on the wafer. The coordinates of the measurement locations are determined using mask data, CAD (computer aided design) data, lithography tool data, and process flow data. The invention applies to various metrology operations and measurements that may be carried out.

Figure 1:
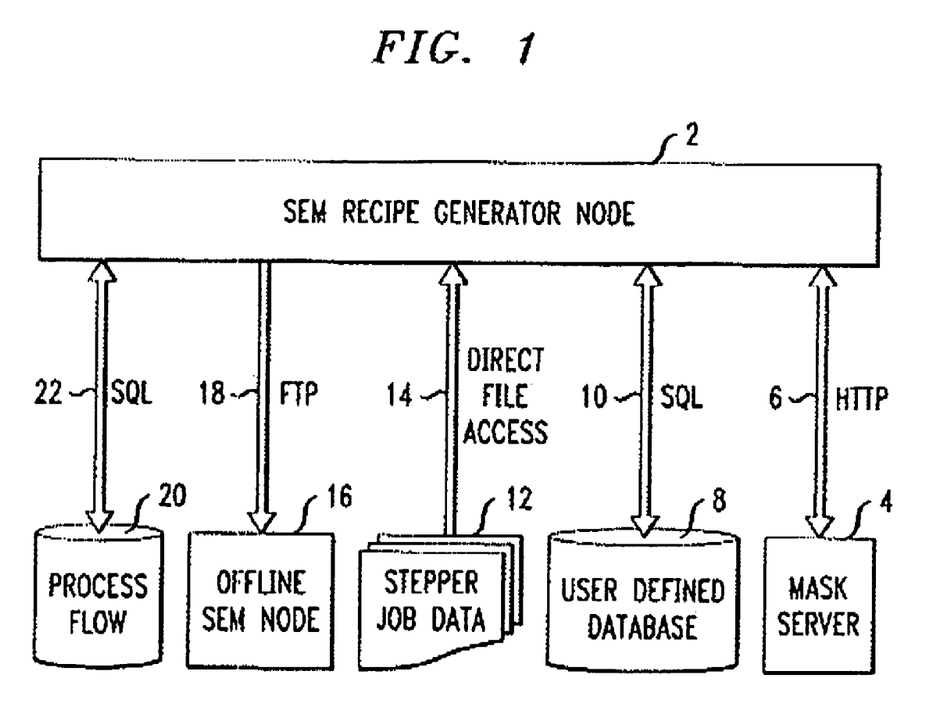
FIG. 1 is a schematic view of an automated waferless recipe generation system according to the invention.

The invention includes a computer program product with encoded instructions for performing operations for the automatic generation of a metrology recipe and a method and system for generating and carrying out the recipe. The metrology recipe may include a set of instructions for a system to locate a particular feature or location and/or which measurements to perform at that feature/location, but the recipe may include other instructions and steps as understood by one of skill in the art. The automated metrology recipe generation software employs an advantageously generic methodology to collect data required to generate each unique recipe. An exemplary system is shown in FIG. 1. FIG. 1 shows SEM recipe generation node 2 in communication with various other nodes or databases. SEM recipe generation node 2 may be a computer product capable of executing the instructions provided by the software and may be a stand-alone unit or may be part of a metrology tool or another suitable piece of equipment. Conventional acronyms are used to define the communication paths that are illustrated in FIG. 1, i.e., hypertext transfer protocol (HTTP); structured query language (SQL); and file transfer protocol (FTP). The present invention applies to various metrology stages such as CD (critical dimension) measurement by a SEM, and others as discussed infra. Similar principles may be used to generate a recipe at SEM recipe generation node 2 at the various metrology stages. Based on part I.D. i.e., the particular semiconductor device, the software at SEM recipe generation node 2 will obtain and collect the necessary additional data by querying various databases: it will calculate feature coordinates and create a file structure for a robust metrology recipe which can be run in automated mode on a metrology tool. Although discussed in terms of a SEM and illustrated using SEM recipe generation node 2 in FIG. 1, it should be understood that such is exemplary only and the principles of the invention refer to other metrology tools as well.

SEM recipe generator node 2 may obtain input parameters such as part I.D. and mask level or fab location from process flow database 20 using SQL 22. SEM recipe generator node 2 uses the information from process flow database 20 to determine the technology type and the recipes required to be created. For a particular part I.D. (i.e., semiconductor device), up to thirty (30) or more recipes may be used for carrying out various metrology operations at various levels.

During data collection mode, the method and computer program product of the invention provide for collecting information regarding the numerous test features available for the device being analyzed. From process flow database 20, SEM recipe generator node 2 obtains data indicating which type of metrology measurement or operation is to be carried out, the number of recipes to be made, and other similar details pertinent to the metrology stage for the particular part I.D. Various metrology recipes may call for measuring various numbers of the multiple test features available on the patterned wafer. In one exemplary embodiment, there may be fifteen (15) measurable test features per test structure and up to ten (10) or more test structures per mask image, i.e., in the reticle field stepped repeatedly onto the water. Various subsets of the total number of test features available, may be used for various operations and will depend on device requirements and the various metrology operations such as electrical testing, CD measurement, thickness, and overlay metrology. Critical dimension (CD) measurement is generally a lateral dimension of a feature formed on a wafer. This lateral dimension may be a space, line width, or proximity between two features. The measurement may be made after development to form a pattern in a photosensitive material or after etching in which a pattern is formed in a film or dielectric used to form a semiconductor device. Other metrology measurements may include film thickness, overlay registration between test features formed at various levels, and various electrical measurements such as sheet resistivity. Other metrology functions may include elemental analysis of material, measurement of an aspect ratio, film stress, step height or sidewall slope of a feature. There are various other metrology functions commonly carried out in the semiconductor manufacturing industry as well.

After obtaining the aforementioned data, SEM recipe generator node 2 will query mask server 4 using HTTP 6 to obtain mask data such as the field size of a mask image, mask shift, scribe line locations and dimensions, and the location of the test features on the mask. These are discussed and illustrated, infra.

Figure 2A:
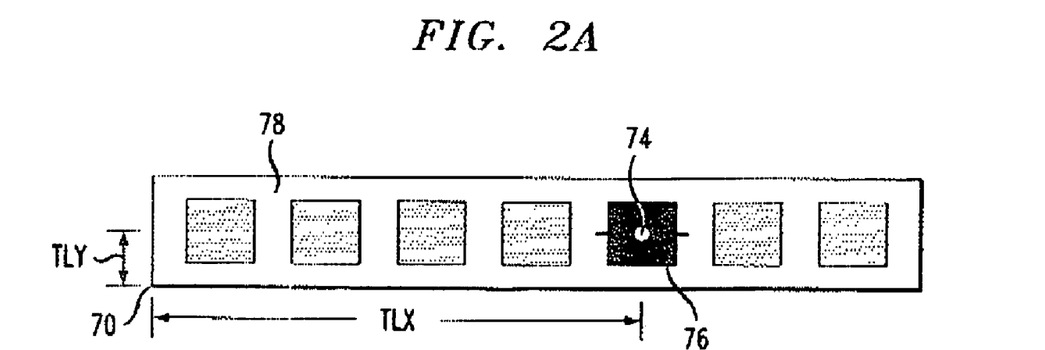
FIG. 2A is a plan view showing the test feature location defined with respect to the test structure.

SEM recipe generator node 2 also has direct file access 14 to stepper job data 12. It should be noted that, according to other exemplary embodiments in which other lithography tools are used, the job data will appropriately pertain to other lithography tools. Stepper job data 12 may include stepping size, wafer shift, field exclusion and x, y grid data indicative of the absolute and relative positions of the various reticle fields or mask images formed on the wafer that combine to form the patterned wafer. User defined database 8 may be compiled from data collected from process flow database 20, mask server 4, CAD mapping and other sources. User defined database 8 advantageously includes information that is user specific and may be changed by the user and/or according to the manufacturing process. SEM recipe generator node 2 queries user defined database 8 using structured query language 10 for data such as pattern recognition templates and feature coordinates. In various exemplary embodiments, user defined database 8 includes feature coordinates which are mapped from a CAD file based on technology node, recipe I.D. and test structure. For example, as shown in FIG. 2A, CAD mapping may be used to obtain test feature coordinate data such as center position 74 of test feature 76 with respect to origin 70 of test structure 78 that includes test feature 76. It should be understood that the designation of the "origin" location is arbitrary and other positions may be used as the origin alternatively. Conventional CD mapping techniques may be used.

The data provided by process flow database 20, determines the mask server 4 data, user defined database 8 data and stepper job database 12 data to be obtained. Returning to FIG. 1, after the data from mask server 4, user defined database 8, and stepper job database 12, is obtained by SEM recipe generator node 2, recipe generation can begin by SEM recipe generator node 2. The software of SEM recipe generator node 2 creates a recipe in a formatted file that allows the recipe to be understood by the software in the SEM or other metrology tool. The recipe includes instructions to direct the metrology tool to one or more locations on a wafer printed to include a pattern formed of a plurality of stepped field images from the reticle. The coordinates of the measurement location have been determined by SEM recipe generator node 2 using the aforementioned data and correspond to locations where the test features are formed on the manufactured wafer. The recipe may advantageously include instructions for the metrology tool to conduct a particular measurement at that location.

In general, there may be two types of files required for a metrology recipe. The first is a file that contains information that is common to all metrology recipes for a particular part I.D. or semiconductor device. Such information may include field size, wafer shift, field exclusion and grid origin as determined from the stepper job data. The second type of file for each recipe is a unique file that calls information that is specific to the particular mask layer. This second type of file includes the coordinates for measurement sites across the wafer which are calculated, as discussed below, by the software using the aforementioned data including x, y grid layout information provided by the stepper job. Each site measured is in a different exposure field, i.e. a different instance of the reticle image being projected onto the wafer (also known as a "shot"). The measurement location is defined within the exposure field by a set of x, y coordinates generated by the recipe. Each mask layer may utilize and require multiple metrology recipes.

Figure 3:
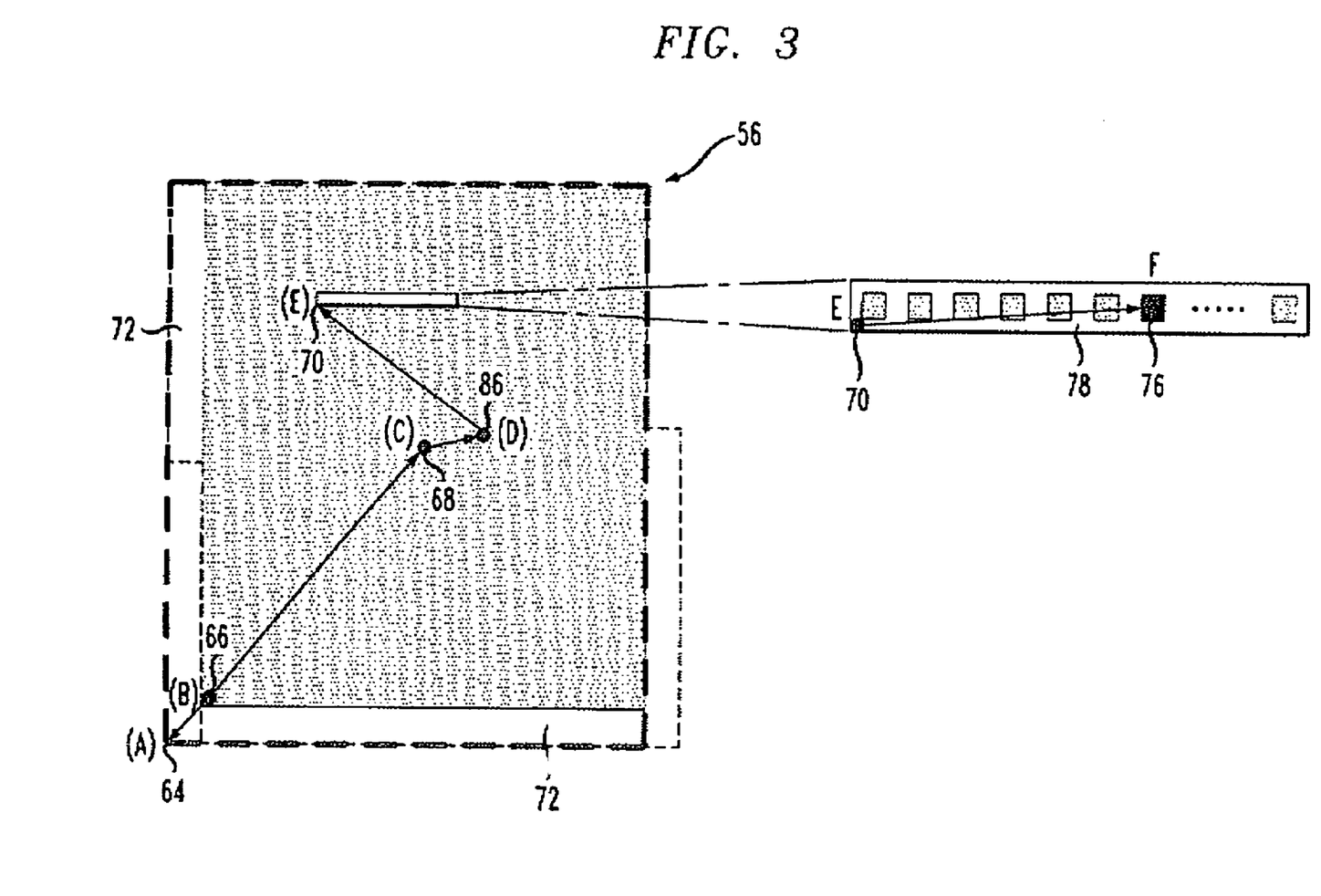
FIG. 3 is a plan view showing the relationship between a test feature and mask field.

To ensure accuracy of the derived measurement locations, detailed mapping of CAD files is carried out for each test feature and entered into user defined database 8. CAD layouts are used to create mask layouts. By mapping the CAD layout data as shown in FIG. 2A and defining the location of test feature 76 with respect to origin 70 of test structure 78, and further defining the location of test structure 78 with respect to arbitrarily designated field (corner) origin 66 using the mask data such as shown in FIG. 3, the recipe provides for improved accuracy. In conventional technology, the mask server only provides a single coordinate set that provides the location of the test structure, e.g., test structure 78 shown in FIG. 2A, with respect to field image center origin 68 such as illustrated in FIG. 3. From this coordinate, the metrology tool must then locate the actual test feature. Generally, this is a cumbersome and time-consuming task that often results in a failure to locate the desired test feature. As such, the further mapping obtained using CAD mapping of the test structure, is essential for accurately locating the measurement locations without referencing a wafer.

The invention provides the advantage that the automatically generated measurement location coordinates direct the metrology tool to a location that will be in close proximity, i.e., within ten (10) microns, of each of the test features actually formed on the wafer when the wafer is automatically loaded within and by the metrology tool. Conventional techniques for globally aligning the various metrology tools to a wafer or the stage upon which the wafer rests, may be used. The global alignment may be used to generally locate origins of each of the reticle fields produced on a wafer.

Figure 2B:
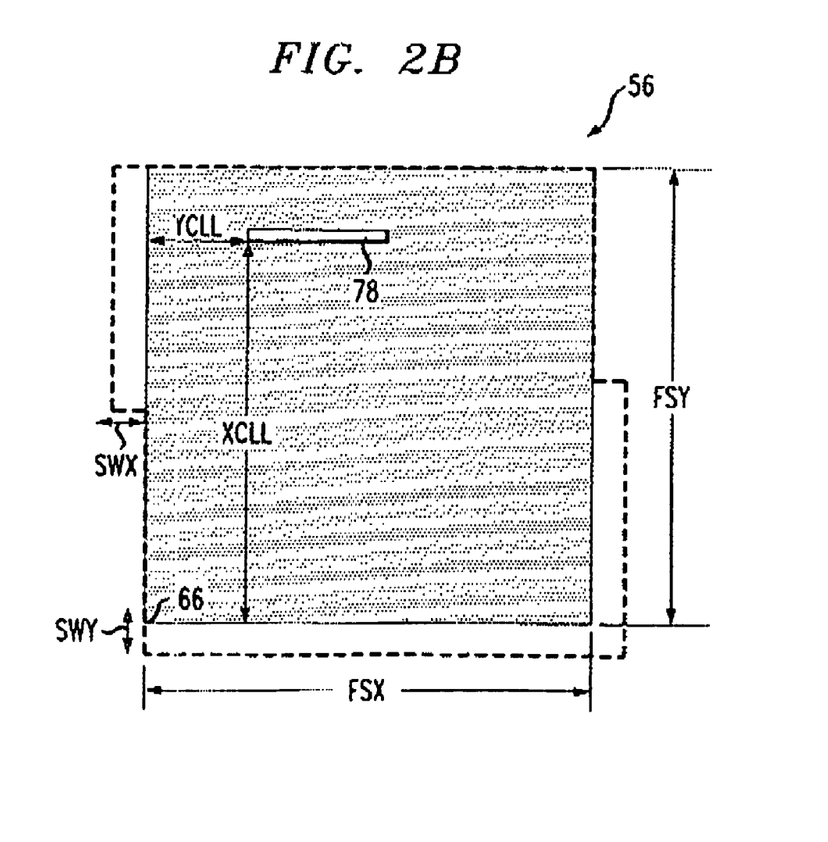
FIG. 2B is a plan view showing the test structure location defined with respect to the mask field.

Determination of the coordinates required by the SEM or other metrology tool is based on a pre-selected and arbitrary origin, such as exemplary field (corner) origin 66 in FIG. 2B. Other locations may be utilized as the origin in other exemplary embodiments. Coordinates define the measurement location and must be translated into coordinates useable by the metrology tool. The data is manipulated according to equations (1) and (2) to provide x, y coordinates of the measurement locations that are within a high degree of accuracy of the physical test feature formed on the wafer.

$$X(um)=[(FSX/2)*M+XCLL-BCX*M-SX]*1000+TLX \quad (1)$$

$$Y(um)=[(FSY/2)*M+YCLL-BCY*M-SWY]*1000+TLY \quad (2)$$

Figure 4:
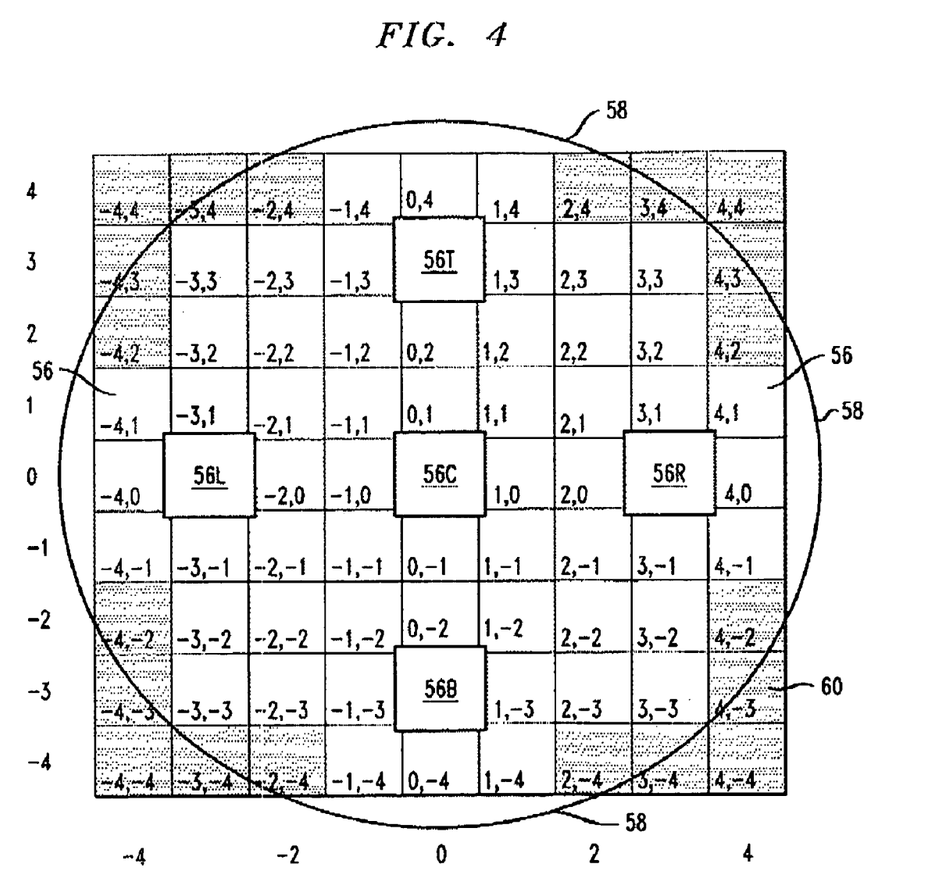
FIG. 4 is a plan view showing a patterned wafer formed of a plurality of mask fields.

In equations (1) and (2), FSX and FSY refer to field size of the image on a mask in the x and y directions, respectively. FSX and FSY are shown in FIG. 2B which illustrates field 56 as may appear in an exemplary reticle. For clarity, the device pattern is not shown in field 56 which may include a single die or an array of die. Using a lithography tool, field 56 is projected onto a wafer a plurality of times such as shown in FIG. 4. FIG. 4 shows wafer 58 with an array superimposed over wafer 58. The array represents a plurality of fields 56 (i.e., mask images) that may be projected from a single reticle, a plurality of times, onto wafer 58. The shaded areas represent locations in which field 56 is not projected onto wafer 58 because portions of field 56 would fall off wafer 58. In the exemplary illustration of FIG. 4, fields 56L (left), 56C (center), 56R (right), 56T (top), and 56B (bottom) may be the exemplary locations at a particular mask level in which metrology measurements are carried out. This is exemplary only and different locations and different numbers of locations may be used in other exemplary embodiments.

Returning to an explanation of equations (1) and (2), M represents magnification of the lithographic system and which forms part of stepper job data 12 of FIG. 1. XCLL and YCLL represent the x, y coordinates, respectively, for the origin of the test structure with respect to the mask field as provided by the mask server. Referring again to FIG. 2B, XCLL and YCLL are the coordinates for the location of origin 70 of test structure 78 which contains test feature 76, with respect to field corner origin 66.

BCX and BCY refer, respectively, to x, and y shift, in particular, to blade center shift. Each represents the shift of the mask image relative to the center of the physical mask. The blade centering correction is shown in FIG. 3 as vector CD SWX/SWY are the x, y widths, respectively of the scribe line, or street, that peripherally surrounds field 56. SWX and SWY are shown in FIG. 2B. TLX and TLY are the x, y coordinates, respectively, that define center position 74 of test feature 76 with respect to origin 70 of test structure 78 as shown in FIG. 2A. These values determine the offset between origin 70 and center position 74 as mapped from a CAD file. Without such CAD mapping, the accuracy of the coordinates x, y, is limited by the size of test structure 78 and therefore diminished.

FIGS. 2A, 2B and 3 are as described previously. Each shows aspects of the field of the reticle, defined in terms of various coordinates. FIG. 3 additionally shows true origin A (64) which is the peripheral corner of field 56 including scribe line 72.

Using equations (1) and (2) and the data described in FIGS. 2A, 2B and 3, the recipe is automatically generated to accurately identify measurement locations $(X_{um}, Y_{um})$ of the test feature (test feature 76) with respect to field (center) origin 66. The recipe includes the number of measurements to be carried out at the particular metrology stage and stepper data such as x, y grid data defining the distance between reticle exposures, accurately describes multiple measurement locations on the wafer formed using the reticle. For each recipe required in the manufacture of a particular part, after the recipe is formed, the software provides that the system connect SEM recipe generation node 2 to an SEM tool, create the required directory structure and insert the files at the appropriate file pathway.

Figure 5:
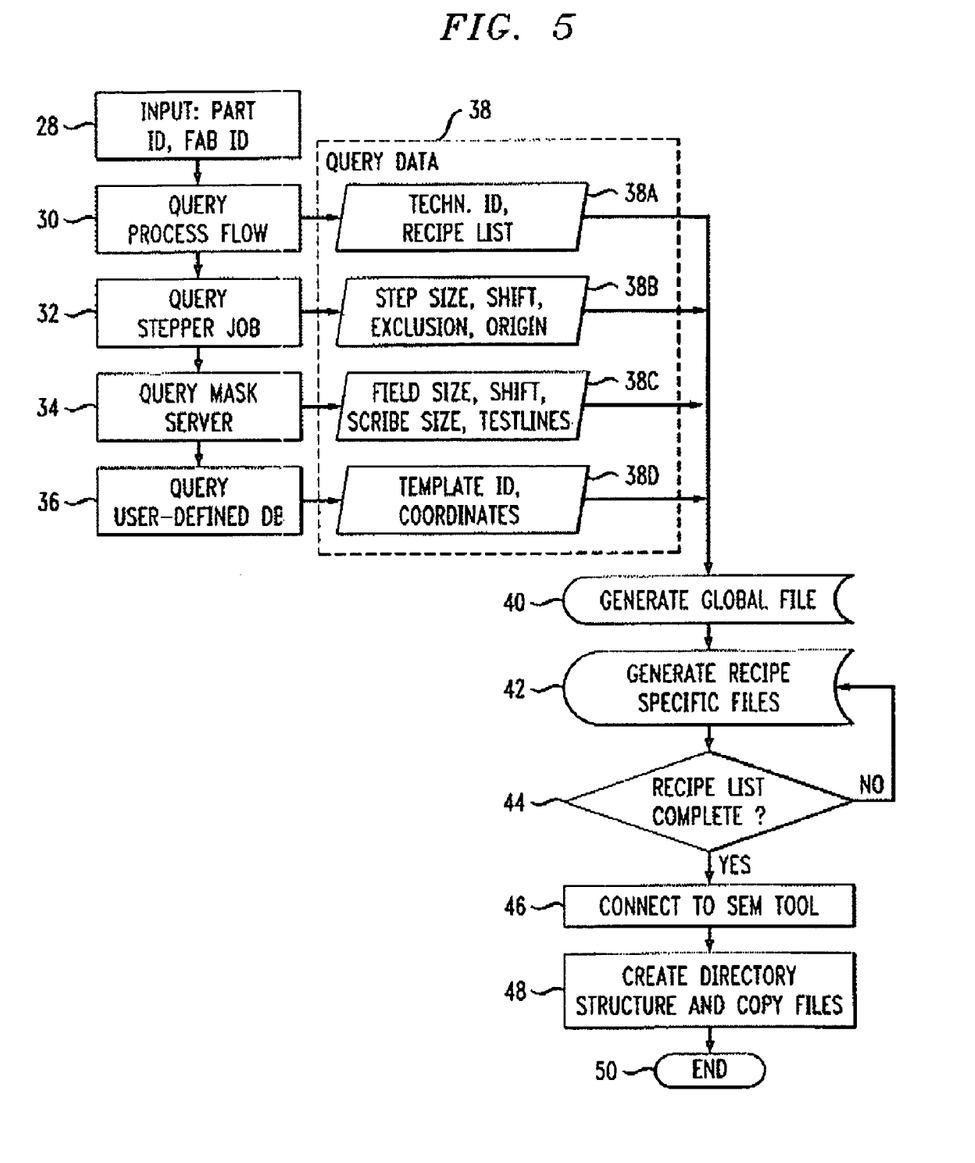
FIG. 5 is a flowchart illustrating an exemplary embodiment for creating a recipe, according to the invention.

FIG. 5 is a block diagram illustrating the basic steps of an algorithm for an automatic, waferless metrology recipe generation. Referring to FIG. 5, block 28 indicates the input of relevant parts of fabrication area data. Blocks 30, 32, 34 and 36 indicate the SEM recipe generation node querying various databases. Block 38 shows the data obtained and includes data obtained by querying the process flow in block 38A, data obtained by querying the stepper job in block 38B, data obtained by querying the mask server in block 38C, and data obtained in querying the user identified database in block 38D. The global file is generated at block 40, and recipe specific files are generated at block 42. If the recipe list is complete, block 44, a connection is made to a SEM tool at block 46 and the directory structure is made and files are copied at block 48.

Recipes created as above can be automatically generated to replace poorly running or inefficiently running recipes according to another aspect of the invention. Typical metrology recipes may suffer from one or more of a plurality of shortcomings such as incorrect coordinate locations, poor pattern recognition and the like. The problematic recipes may be technology specific, device type (part) specific, mask level specific or recipe programmer specific, to list a few. In another embodiment, the poorly running recipes of the data base may include another common shortcoming.

The invention further provides for accessing and manipulating a data base containing multiple recipes that may be available in a semiconductor device fabrication area, for example. A criterion such as mask level, part (device type) identification, or technology type is input into a system that accesses the database. In one exemplary embodiment, all contact or via level metrology recipes may be called for by inputting a characteristic or criteria that is common to only and all contact or via level metrology recipes. In other exemplary embodiments, the criteria may be a shortcoming such as extended execution time, poor pattern definition, errors for incorrect coordinate location or any of various other criteria indicative of shortcomings or errors experienced when the metrology recipe is being run.

A computer program product with encoded instructions queries the data base based upon the input criteria and identifies all recipes from the data base that satisfy the criteria; the computer program product with encoded instructions then overwrites or replaces each identified recipe with the auto-created recipe generated without referencing any test features on a semiconductor wafer, as described above.

The preceding merely illustrates the principles of the invention. It will thus be appreciated that those skilled in the art will be able to devise various arrangements which, although not explicitly described or shown herein, embody the principles of the invention and are included within its spirit and scope. For example, the invention has been generally described in conjunction with an SEM metrology tool. The invention is not, however, limited to an SEM tool and the principles methods and software of the disclosed invention fine application and other metrology tools.

Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof should be construed to refer to the orientation as then described or as shown in the drawing under discussion. These relative terms are for convenience of description and do not require that the apparatus be constructed or operated in a particular orientation. Terms concerning attachments, coupling and the like, such as "coupled," "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of directing a metrology tool to a measurement location of a test feature formed on a wafer in a pattern transferred from a mask onto said wafer, said method comprising:
    determining coordinates of at least one measurement location of said test feature on said wafer by manipulating mask data, CAD data, and lithography tool data,
    the mask data including field size of a mask image, width of a scribe line peripherally surrounding said mask image, center shift of said mask image relative to a mask origin, and test structure coordinates indicative of a test structure origin relative to said mask origin,
    the CAD data including test feature coordinate data indicative of a position of said test feature relative to said test structure origin, and
    the lithography tool data including a mask magnification factor; and
    automatically creating a metrology recipe including instructions that, by themselves, to direct said metrology tool to at least one said measurement location without said metrology tool optically referencing said test feature formed on said wafer;
    providing said metrology recipe to said metrology tool;
    said metrology recipe directing said metrology tool to said measurement location based only on said instructions; and
    said metrology tool automatically measuring said test feature at said measurement location.

2. The method as in claim 1, wherein said measurement location is within 10 microns of said test feature as formed on said wafer.

3. The method as in claim 1, further comprising performing CAD mapping to obtain said test feature coordinate data.

4. The method as in claim 1, wherein
    the mask comprises a reticle having a reticle pattern,
    the pattern comprises a plurality of said reticle patterns formed on said wafer,
    the lithography tool data further includes x, y grid data indicative of locations of said reticle patterns on said wafer,
    the determining comprises determining coordinates of a plurality of said measurement locations, each defined relative to a corresponding one of said mask origins, and
    the metrology tool automatically measuring said test feature comprises measuring a plurality of said test features, each starting at a corresponding one of said measurement locations, and includes said metrology tool locating a plurality of origin locations on said wafer, each corresponding to one of said mask origins, based on said x, y grid data.

5. The method as in claim 4, wherein the automatically measuring further comprises said metrology tool automatically globally aligning to locate each of said origin locations.

6. The method as in claim 1, wherein said measurement location is within 10 microns of said test feature when said wafer is automatically loaded onto said metrology tool.

7. The method as in claim 1, wherein said mask comprises a reticle, said pattern comprises a plurality of reticle patterns formed on said wafer, said determining coordinates comprises determining a plurality of said measurement locations, wherein said lithography tool data further includes x, y grid data indicative of locations of said reticle patterns on said wafer, said automatically creating includes defining each of said coordinates relative to a corresponding said mask origin, and wherein said metrology recipe directing said metrology tool further comprises causing said metrology tool to locate each of said plurality of measurement locations by first locating a corresponding one of said mask origins using global alignment techniques.

8. The method as in claim 1, further comprising providing instructions to said metrology tool indicative of a type of measurement to be performed.

9. The method as in claim 8, wherein said type of measurement comprises critical dimension (CD) measurement.

10. The method as in claim 1, further comprising querying a process flow data base to determine a mask level and wherein at least said mask data and said CAD data are based on said mask level.

11. The method as in claim 1, wherein said determining includes a recipe generator apparatus querying a mask server to obtain said mask data, querying a CAD data base to obtain said CAD data and querying a lithography tool server to obtain said lithography tool data.

12. The method as in claim 1, further comprising, prior to said determining:
providing a database containing a plurality of existing first recipes for metrology measurement;
inputting at least one criterion to a system that accesses said database;
a computer product querying said database and identifying at least one identified recipe of said plurality of existing first recipes that satisfies said criteria; and
wherein said metrology recipe is one said at least one identified recipe.

13. A method of directing a metrology tool to a measurement location of a test feature formed on a wafer in a pattern transferred from a mask onto said wafer, said method comprising:
querying a process data base to identify a mask level;
querying a mask server to obtain mask data, querying a user defined data base to obtain CAD data, querying a lithography data base to obtain lithography tool data and manipulating said mask data, CAD data, and lithography tool data, said CAD data and said mask data dependant or said mask level;
determining at least one measurement location on said wafer, each said measurement location having coordinates determined by said mask data, said CAD data, and said lithography tool data and representing a location of said test feature on said wafer; and
automatically creating said a metrology recipe including instructions that, by themselves, direct said metrology tool to locate the at least one measurement location without said metrology tool optically referencing the test feature formed on the wafer and to perform a measurement at the measurement location;
providing said metrology recipe to said metrology tool;
said metrology recipe directing said metrology tool to said measurement location based only on said instructions; and
said metrology tool automatically measuring said test feature at said measurement location.

14. The method as in claim 13, wherein
the mask data includes field size of a mask image, width of a scribe line peripherally surrounding the mask image, center shift of the mask image relative to a mask origin, and coordinates indicative of a test structure origin relative to the mask origin,
the CAD data includes test feature coordinate data indicative of a position of the test feature relative to the test structure origin,
the lithography tool data includes a mask magnification factor, and
the measurement location is within 10 microns of the test feature as formed on the wafer.

15. The method as in claim 13, wherein the pattern comprises a plurality of mask patterns formed from the mask, the lithography tool data includes x, y grid data indicative of locations of the mask origin formed on the wafer, and the automatically creating further includes further instructions directing the metrology tool to perform a measurement at a plurality of the measurement locations, each defined relative to the mask origin and a corresponding one of the locations.

16. A computer readable storage medium encoded with computer program code, wherein when the computer program code is executed a processor, the processor performs a method for directing a metrology tool to a measurement location of a test feature formed on a wafer in a pattern transferred from a mask onto said wafer, said method comprising:
determining coordinates of at least one measurement location of the test feature on the wafer by manipulating mask data, CAD data, and lithography tool data,
the mask data including field size of a mask image, width of a scribe line peripherally surrounding the mask image, center shift of the mask image relative to a mask origin, and test structure coordinates indicative of a test structure origin relative to the mask origin,
the CAD data including test feature coordinate data indicative of a position of the test structure relative to the test structure origin, and
the lithography tool data including a mask magnification factor; and
automatically creating the metrology recipe that includes instructions that, by themselves, direct the metrology tool to at least one said measurement location without said metrology tool optically referencing the test feature on the wafer;
delivering said metrology recipe to said metrology tool;
said metrology recipe directing said metrology tool to said measurement location based only on said instructions; and
said metrology tool automatically measuring said test feature at said measurement location.

17. The computer readable storage medium as in claim 16, the computer readable storage medium further comprising further instructions for performing CAD mapping to obtain the test feature coordinate data.

18. The computer readable storage medium as in claim 16, wherein the measurement location is within 10 microns of the test feature on the wafer when the wafer is automatically loaded onto the metrology tool.

19. The computer readable storage medium as in claim 16, the computer readable storage medium further comprising further instructions that identify a type of metrology measurement to be carried out.

20. The computer readable storage medium as in claim 19, wherein the mask comprises a reticle, the pattern comprises a plurality of reticle patterns formed on the wafer, the lithography tool data further includes x, y grid data indicative of locations of the reticle patterns on the wafer, the determining comprises further instructions for determining coordinates of a plurality of the measurement locations, each defined relative to a corresponding, one of the mask origins, and wherein the instructions that, by themselves, direct the metrology tool to perform a type of metrology measurement comprise instructions for measuring a plurality of the test features and includes the metrology tool locating a plurality of origin locations on the wafer, each corresponding to one of the mask origins, based on the x, y grid data.

21. The computer readable storage medium as in claim 20, wherein the metrology recipe further directs the metrology tool to automatically globally align to each of the origin locations and to perform a measurement at each the measurement location.

22. The computer readable storage medium as in claim 20, wherein said method further comprises:
accessing a database containing a plurality of existing first recipes for metrology measurement;
querying said database and identifying at least one identified recipe of said plurality of existing first recipes that satisfies at least one criteria input to said database; and
wherein said metrology recipe is one said at feast one identified recipe.

23. The computer readable storage medium as in claim 22, wherein said criteria comprises at least one of technology type, mask level, and device type.

24. The computer readable storage medium as in claim 16, wherein the method further comprises querying a process flow data to determine mask level, wherein at least the mask data and the CAD data depend upon the mask level.

25. The computer readable storage medium as in claim 16, wherein the method further comprises:
a recipe generator apparatus querying a mask server to obtain the mask data, querying a user defined data base to obtain the CAD data and querying a lithography tool server to obtain the lithography tool data.

26. A computer readable storage medium encoded with computer code, wherein when the computer program code is executed by a processor, the processor performs a method for directing for a metrology tool to at feast one measurement location of a test feature formed on a wafer in a pattern transferred from a mask onto said wafer, the method comprising:
querying a process data base to identify a mask level;
querying a mask server to obtain mask data, querying a user defined data base to obtain CAD data, querying a lithography tool data base to obtain lithography tool data and manipulating the mask data, CAD data, and lithography tool data, the CAD data and the mask data dependant on the mask level;
determining at least one measurement location on the wafer, the measurement location having coordinates determined by manipulating the mask data, the CAD data, and the lithography tool data and representing a location of the test feature on the wafer; and
automatically creating a metrology recipe for that, by itself, directs the metrology tool to the at least one measurement location and to perform a measurement at the measurement location without the metrology tool optically referencing the test feature formed on the wafer;
delivering said metrology recipe to said metrology tool;
said metrology recipe directing said metrology tool to the measurement location based only on said metrology recipe; and
said metrology tool automatically measuring said at least one feature at the at least one measurement location.

27. The computer readable storage medium as in claim 26, wherein
the mask data includes field size of a mask image, width of a scribe line peripherally surrounding the mask image, center shift of the mask image relative to a mask origin, and coordinates indicative of a test structure origin relative to the mask origin,
the CAD data includes test feature coordinate data indicative of a position of the test feature relative to the test structure origin,
the lithography tool data includes a mask magnification factor, and
the measurement location is within 10 microns of the test feature formed on the wafer.

28. A metrology recipe creation system for automatic generation of a metrology recipe that directs a metrology tool to locate and measure a test feature formed on a wafer in a pattern transferred from a mask onto said wafer, the system comprising:
a metrology tool;
means for determining coordinates of at least one measurement location of the test feature on the wafer by manipulating mask data, CAD data, and lithography tool data,
the mask data including field size of a mask image, width of a scribe line peripherally surrounding the mask image, center shift of the mask image relative to a mask origin, and test structure coordinates indicative of a test structure origin relative to the mask origin,
the CAD data including test feature coordinate data indicative of a position of the test feature relative to the test structure origin, and
the lithography tool data including a mask magnification factor; and
means for automatically creating the metrology recipe that, by itself, directs the metrology tool to locate and measure the test feature formed; and
means for delivering said metrology recipe to said metrology tool and causing said metrology tool to locate the test feature based only on said metrology recipe; and
means for causing said metrology tool to automatically measure said test feature at the measurement location.

29. The metrology recipe creation system as in claim 26, the metrology tool including means for locating a plurality of mask origins formed on the wafer and wherein the means for automatically creating the metrology recipe includes the metrology recipe identifying a plurality of measurement locations based on the plurality of mask origins.

30. The metrology recipe creation system as in claim 28, further comprising means for querying the mask data, the CAD data and the lithography tool data.

31. The metrology recipe creation system as in claim 28, further comprising:
a database containing a plurality of existing first recipes for metrology measurement;
a first system that accesses said database;
means for inputting at least one criteria to said first system; and
a computer readable storage medium encoded with computer code, wherein when the computer program code is executed by a processor, the processor performs a method for querying said database and identifying at least one identified recipe of said plurality of existing first recipes that satisfies said at least one criteria, and
wherein said metrology recipe is one of said at least one identified recipe.

32. The metrology recipe creation system as in claim 28, wherein said criteria comprises at least one of technology type, mask level, and device type.

\* \* \* \* \*

UNITED STATES PATENT AND TRADEMARK OFFICE
CERTIFICATE OF CORRECTION

PATENT NO.         : 7,631,286 B2
APPLICATION NO.    : 11/323255
DATED              : December 8, 2009
INVENTOR(S)        : Daniel Piper et al.

Page 1 of 1

It is certified that error appears in the above-identified patent and that said Letters Patent is hereby corrected as shown below:

Title page, under (73) Assignee, replace "Wafertech LLC" with --WaferTech LLC--
    Column 1, line 64, replace "waterless" with --waferless--
    Column 7, line 52, replace "SX" with --SWX--
    Claim 1, Column 10, line 22, replace "to direct" with --direct--
    Claim 13, Column 11, line 41, replace "or said" with --on said--
    Claim 13, Column 11, line 47, replace "said a" with --a--
    Claim 16, Column 12, line 15, replace "executed" with --executed by--
    Claim 22, Column 13, line 15, replace "feast" with --least--
    Claim 26, Column 13, line 33, replace "directing for" with --directing--
    Claim 26, Column 13, line 33, replace "feast" with --least--
    Claim 28, Column 14, line 32, replace "feature formed" with --feature--

Signed and Sealed this

Thirteenth Day of April, 2010

David J. Kappos
*Director of the United States Patent and Trademark Office*